US012439560B2

(12) United States Patent
Hafner et al.

(10) Patent No.: US 12,439,560 B2
(45) Date of Patent: Oct. 7, 2025

(54) REFRIGERATION CIRCUIT DEVICE, AND METHOD FOR OPERATING A REFRIGERATION CIRCUIT DEVICE OF THIS TYPE

(71) Applicant: VIESSMANN CLIMATE SOLUTIONS SE, Allendorf (DE)

(72) Inventors: Ulrich Hafner, Burgwald (DE); Christopher Wrede, Medebach (DE)

(73) Assignee: VIESSMANN CLIMATE SOLUTIONS SE, Allendorf (DE)

( * ) Notice: Subject to any disclaimer, the term of this patent is extended or adjusted under 35 U.S.C. 154(b) by 127 days.

(21) Appl. No.: 18/029,221

(22) PCT Filed: Oct. 5, 2021

(86) PCT No.: PCT/DE2021/100798
§ 371 (c)(1),
(2) Date: Mar. 29, 2023

(87) PCT Pub. No.: WO2022/073555
PCT Pub. Date: Apr. 14, 2022

(65) Prior Publication Data
US 2023/0380109 A1    Nov. 23, 2023

(30) Foreign Application Priority Data

Oct. 9, 2020    (DE) .................. 10 2020 126 580.8

(51) Int. Cl.
*H05K 7/20*    (2006.01)
(52) U.S. Cl.
CPC ..... *H05K 7/20354* (2013.01); *H05K 7/20309* (2013.01); *H05K 7/20318* (2013.01); *H05K 7/2039* (2013.01)

(58) Field of Classification Search
CPC ........ F25B 2400/0409; F25B 2400/054; F25B 41/39; F25B 41/385; H05K 7/20354
See application file for complete search history.

(56) References Cited

U.S. PATENT DOCUMENTS 6,568,198 B1 * 5/2003 Tadano .................. F25B 41/24
62/217
10,088,216 B2 * 10/2018 Chae ......................... F25B 5/04
(Continued)

FOREIGN PATENT DOCUMENTS

DE           102 39 877 A1    3/2004
DE      10 2013 113 221 A1    6/2015
(Continued)

OTHER PUBLICATIONS

International Search Report in PCT/DE2021/100798, mailed Jan. 21, 2022.
(Continued)

*Primary Examiner* — Lionel Nouketcha
(74) *Attorney, Agent, or Firm* — Collard & Roe, P.C.

(57) ABSTRACT

A refrigeration circuit device includes a compressor for compressing a refrigerant, As viewed in the refrigerant flow direction, a condenser is connected downstream of the compressor, a first expansion device is connected downstream of the condenser, a heat exchanger is connected downstream of the first expansion device, a second expansion device is connected downstream of the heat exchanger, an evaporator is connected downstream of the second expansion device, and the compressor is connected downstream of the evaporator. The heat exchanger is configured for connection to an electronic device that is to be cooled, is configured as an internal heat exchanger for additional transfer of heat to the refrigerant, and includes a primary side, connected on one side to the first and on the other side (Continued)

Figure 1:
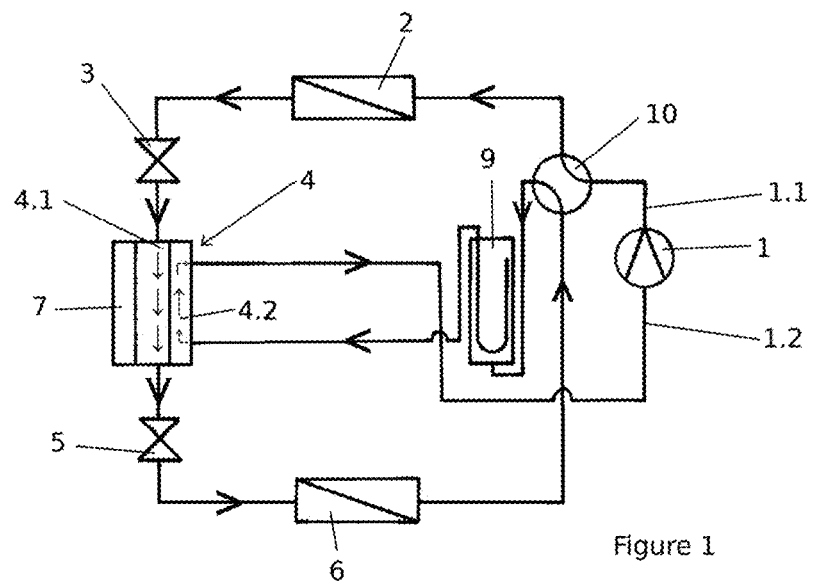

to the second expansion device, and a secondary side, connected on one side to the evaporator and on the other side to the compressor.

11 Claims, 2 Drawing Sheets

(56) References Cited

U.S. PATENT DOCUMENTS

| | | | |
|---|---|---|---|
| 2006/0080989 A1 | 4/2006 | Aoki et al. | |
| 2012/0000630 A1* | 1/2012 | Reiss | H05K 7/20354 165/104.11 |
| 2012/0255319 A1* | 10/2012 | Itoh | F25B 41/20 62/226 |
| 2015/0082823 A1* | 3/2015 | Teraki | H05K 7/20254 361/699 |
| 2017/0151856 A1* | 6/2017 | Kuwahara | B60H 1/3207 |
| 2019/0257532 A1 | 8/2019 | Sakabe et al. | |
| 2019/0257562 A1 | 8/2019 | Walter | |

FOREIGN PATENT DOCUMENTS

| | | |
|---|---|---|
| DE | 10 2014 102 005 A1 | 6/2015 |
| DE | 11 2015 003 005 T5 | 3/2017 |
| DE | 10 2017 107 051 A1 | 10/2018 |
| EP | 1 519 127 A1 | 3/2005 |
| EP | 1 647 783 A2 | 4/2006 |
| EP | 2 083 229 B1 | 7/2009 |
| EP | 2 489 774 B1 | 6/2015 |
| JP | H02-73562 U | 6/1990 |
| WO | 2017/212058 A1 | 12/2017 |

OTHER PUBLICATIONS

International Search Report in PCT/DE2021/100800, mailed Jan. 21, 2022.

Wikipedia document, "Expansion Valve" (see also https://de.wikipedia.org/w/index.php?title=Expansionsventil&oldid=179418293) Last edited Jul. 24, 2018; Retrieved on Mar. 29, 2023.

Wikipedia document, "Plate Heat Exchanger" (see also https://de.wikipedia.org/w/index.php?title=Plattenw%C3%A4rme%C3%BCbertrager&oldid=199812395), Last edited May 10, 2020; Retrieved on Mar. 29, 2023.

English translation of the International Preliminary Report on Patentability and Written Opinion of the International Searching Authority in PCT/DE2021/100798, dated Mar. 28, 2023.

* cited by examiner

REFRIGERATION CIRCUIT DEVICE, AND METHOD FOR OPERATING A REFRIGERATION CIRCUIT DEVICE OF THIS TYPE

CROSS REFERENCE TO RELATED APPLICATIONS

This application is the National Stage of PCT/DE2021/100798 filed on Oct. 5, 2021, which claims priority under 35 U.S.C. § 119 of German Application No. 10 2020 126 580.8 filed on Oct. 9, 2020, the disclosure of which is incorporated by reference. The international application under PCT article 21(2) was not published in English.

The invention relates to a refrigeration circuit device according to the preamble of claim 1 and a method for operating a refrigeration circuit device of this type according to claim 7.

A refrigeration circuit device of the type mentioned in the introduction is disclosed in the document EP 2 083 229 B1. This refrigeration circuit device consists of a compressor for compressing a refrigerant, wherein—in each case as viewed in the flow direction of the refrigerant—a condenser is connected downstream of the compressor, a first expansion device is connected downstream of the condenser, a heat exchanger is connected downstream of the first expansion device, a second expansion device is connected downstream of the heat exchanger, an evaporator is connected downstream of the second expansion device and the compressor is later connected downstream of the evaporator, wherein the heat exchanger is configured to be connected to an electronic device that is to be cooled. In this solution, the first expansion device is configured as a fixed throttle and the second expansion device is configured as a variable throttle. The stipulation "later" is understood to mean in this case (and namely also hereinafter) that the evaporator is configured to be selectively connected to the compressor directly or also by the interposition of one or more components, such as for example a liquid separator.

The object of the invention is to improve a refrigeration circuit device of the type mentioned in the introduction and the method for the operation thereof. In particular, a refrigeration circuit device is intended to be provided in which the so-called suction gas temperature can also be influenced, i.e. the temperature of the refrigerant suctioned by the compressor.

This object is achieved in terms of the subject matter by a refrigeration circuit device of the type mentioned in the introduction, by the features set forth in the characterizing part of claim 1. The technical features in terms of the method for solving this object are set forth in claim 7.

According to the invention, in terms of subject matter it is thus provided that the heat exchanger is configured as an internal heat exchanger for the additional transfer of heat to the refrigerant and comprises a primary side which is connected on the one hand to the first expansion device and on the other hand to the second expansion device, and a secondary side which is connected on the one hand to the evaporator and on the other hand to the compressor. Expressed in terms of the technical method, it is provided that the temperature of the electronic device, preferably a frequency converter, is selectively controlled with the aid of the first and/or second expansion device. These measures ensure that the temperature does not drop below the dew point on the electronic device, and the maximum permitted temperature of the electronic device is not exceeded.

In other words, the refrigeration circuit device according to the invention is characterized in that the heat exchanger which is configured as a so-called "internal heat exchanger", is now configured to exchange heat at the same time both with the electronic device that is to be cooled and also with the refrigerant flowing from the evaporator to the compressor. An "internal heat exchanger", considered more specifically, is correspondingly to be understood as such a heat exchanger in which energy from the condensed refrigerant (refrigerant condensate) is transferred to the refrigerant suctioned by the compressor (suction gas) for controlling the suction gas temperature.

Further advantageous developments of the refrigeration circuit device according to the invention and the method for the operation thereof are found in the dependent claims.

For the sake of completeness, reference is now made to the document DE 11 2015 003 005 T5. In this solution, however, the electronic device that is to be cooled is missing on the internal heat exchanger; it should also be mentioned at this point that due to the foreseeable high complexity of the control resulting therefrom, this solution would not encourage a person skilled in the art to arrange an electronic device that is to be cooled on the internal heat exchanger.

Moreover, reference is also made to the documents US 2006/0080989 A1, DE 102 39 877 A1, JP H02-73562 U and US 2019/0257562 A1.

The refrigeration circuit device according to the invention, including the advantageous developments thereof according to the dependent claims, is explained in more detail hereinafter with reference to the graphic representation of various exemplary embodiments.

SCHEMATICALLY

Figure 2:
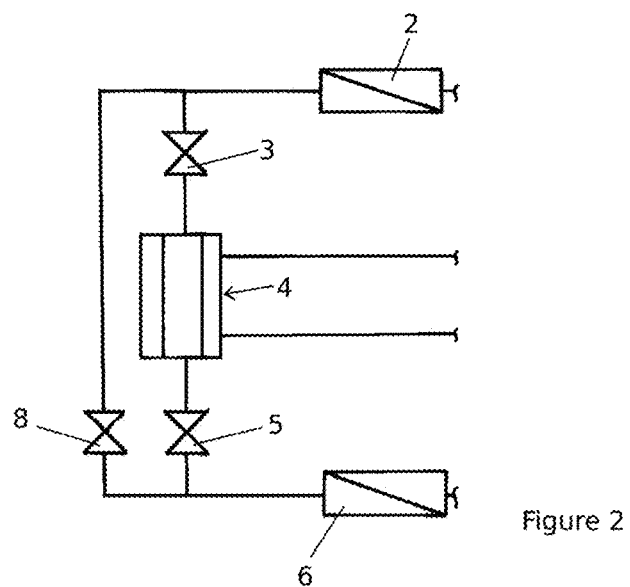
Figure 3:
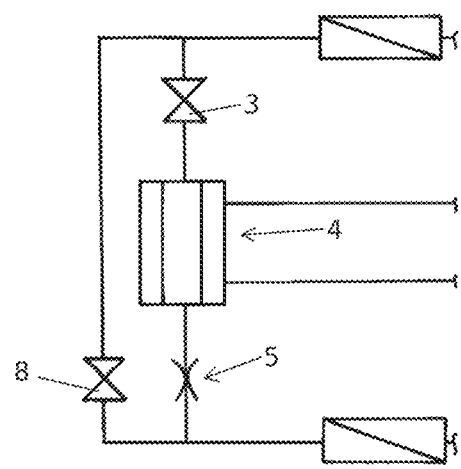

FIG. 1 shows a first embodiment of the refrigeration circuit device according to the invention with controllable expansion devices;

FIG. 2 partially shows a second embodiment of the refrigeration circuit device according to the invention with an additional expansion device; and FIG. 3 partially shows a third embodiment of the refrigeration circuit device according to the invention with a non-controllable or fixed second expansion device.

The refrigeration circuit device shown in the figures consists in the known manner initially of a compressor 1 for compressing a refrigerant, wherein—in each case as viewed in the flow direction of the refrigerant—a condenser 2 is connected downstream of the compressor 1, a first expansion device 3 is connected downstream of the condenser 2, a heat exchanger 4 is connected downstream of the first expansion device 3, a second expansion device 5 is connected downstream of the heat exchanger 4, an evaporator 6 is connected downstream of the second expansion device 5, and the compressor 1 is later connected downstream of the evaporator 6, wherein the heat exchanger 4, preferably the primary side 4.1 thereof, is configured to be connected to an electronic device 7 that is to be cooled.

As can be seen from FIG. 1, it is particularly preferably provided that a changeover valve 10, preferably a 4-2 way valve, which is connected both to a pressure side 1.1 and to a suction side 1.2 of the compressor 1, is provided for switching between a heating mode and a cooling mode (i.e. two operating modes in which the refrigeration circuit device can be operated). In the switching position of the changeover valve 10, shown in FIG. 1, which is called operating mode I hereinafter, as specified above, in this case the reference sign 2 is assigned to the condenser and the reference sign 6 is assigned to the evaporator. After the changeover valve 10 is switched (which is called operating mode II hereinafter) the heat exchanger with the reference sign 6 then becomes the condenser and correspondingly the heat exchanger with the reference sign 2 becomes the evaporator.

Whether the operating mode I is denoted as the heating mode or the cooling mode, ultimately depends simply on the direction in which the heat transport takes place or is intended to take place. Hereinafter for the sake of simplicity—and which is also possible due to the symmetrical construction of the refrigeration circuit device according to the invention—the operating mode I is equivalent to the heating mode and the operating mode II is equivalent to the cooling mode.

It is thus essential to the refrigeration circuit device according to the invention, and this applies to all illustrated and conceivable embodiments, that the heat exchanger 4 is configured as an internal heat exchanger for additionally transferring heat to the refrigerant, and has a primary side 4.1 which is connected on the one hand to the first expansion device 3 and on the other hand to the second expansion device 5, and a secondary side 4.2 which is connected on the one hand to the evaporator 6 and on the other hand to the compressor 1. Quite particularly preferably, it is provided that the heat exchanger 4 is configured as a plate heat exchanger (see also https://de.wikipedia.org/w/index.php?title=Plattenw%C3%A4rme%C3%BC bertrager&oldid=199812395), wherein the (relatively warm) primary side 4.1 of the heat exchanger 4 is formed from external channels of the plate heat exchanger to avoid the formation of condensed water; and the secondary side 4.2 is thus arranged internally. In other words: in the heat exchanger 4 the "warm side" is external.

Expressed in terms of the method, it is correspondingly provided that the temperature of the electronic device 7 is selectively controlled with the aid of the first and/or second expansion device 3, 5.

As can be seen from the figures, there are various possibilities for implementing these measures in practice.

In the solution according to FIG. 1, it is preferably provided that the first and second expansion devices 3, 5 are configured to be controllable.

In the solutions according to FIGS. 2 and 3, it is preferably provided that an additional expansion device 8 (which is preferably also configured to be controllable) is arranged parallel to the heat exchanger 4 and between the condenser 2 and the evaporator 6. In the solution according to FIG. 2, all of the expansion devices 3, 5 and 8 are controllable, and in the solution according to FIG. 3 the expansion devices 3 and 8 are controllable. The second expansion device 5 is configured to be uncontrollable or fixed. Alternatively, however, it can also be provided (which is not shown separately) that the expansion devices 5 and 8 are configured to be controllable and the expansion device 3 is configured to be uncontrollable. In other words: it is preferably provided that the additional expansion device 8 is configured to be controllable and the first or second expansion device 3, 5 are configured to be selectively uncontrollable or fixed. Expressed in terms of the method: it is preferably provided that the temperature of the electronic device 7 is selectively controlled with the aid of the first or the second expansion device 3, 5 and with the aid of an additional expansion device 8 arranged parallel to the heat exchanger 4 and between the condenser 2 and the evaporator 6.

With further reference to FIG. 1, wherein this can also apply to the embodiments according to FIGS. 2 and 3, it is further preferably provided that in the selected switching position (operating mode I) of the changeover valve 10, and as viewed in the flow direction of the refrigerant, a liquid separator 9 is arranged between the evaporator 6 and the secondary side 4.2 of the internal heat exchanger 4. Expressed in terms of the method, it is correspondingly preferably provided that the refrigerant evaporated on the evaporator 6 is initially fed to a liquid separator 9 and then to the secondary side 4.2 of the internal heat exchanger 4. Proceeding from the other operating mode, i.e. operating mode II, the liquid separator 9 is then naturally arranged between the heat exchanger 2 operating as the evaporator and the secondary side 4.2 of the internal heat exchanger 4.

As can be seen in FIG. 1, such a liquid separator consists of a container which is configured to be connected at its lower end to the evaporator 6 (or in operating mode II correspondingly to the condenser). Moreover, a pipe which is bent in a U-shaped manner is provided, said pipe having an opening at its one free end and at its lowest point. The pipe is connected with its other free end to the secondary side 4.2 of the internal heat exchanger 4. Refrigerant vapor is suctioned via the opening at the free end. The opening at the lowest point serves to suction the mixture of refrigerant and oil deposited in the container and to feed it to the compressor for lubrication.

According to a further embodiment, not shown separately, it is also preferably provided that the refrigerant is fed to a liquid separator 9 arranged between the compressor 1 and the first expansion device 3, namely on the so-called high-pressure side of the refrigeration circuit.

Moreover, it is preferably provided that in heating mode, the first expansion device 3 and/or the second expansion device 5 are or is selectively controlled for a suction gas superheat of 5 to 15 K. As a result, it is ensured that the temperature does not drop below the dew point on the electronic device and the minimum oil temperature, and at the same time the oil sump temperature is also not exceeded.

Considered in more detail, it is particularly preferably provided that, in particular in heating mode, for controlling the suction gas temperature, the first expansion device 3 and/or the second expansion device 5 is selectively controlled as a function of a rotational speed of the compressor 1.

Relative to this rotational speed dependency, it is particularly preferably provided that at a low rotational speed of the compressor 1 in heating mode, the first expansion device 3 and/or the second expansion device 5 are selectively controlled for a suction gas superheat of 10 to 15 K. At a higher rotational speed of the compressor 1 in heating mode, alternatively it is preferably provided that the first expansion device 3 and/or the second expansion device 5 are selectively controlled for a suction gas superheat of 5 to 10 K.

Finally, it is preferably provided that to avoid the temperature falling below a dew point or condensed water being formed in cooling mode, in which the maximum oil sump temperature cannot be exceeded, the expansion device 5 (see FIG. 1) or 8 (see FIG. 3) which is connected upstream of the heat exchanger 4, as viewed in the flow direction of the refrigerant, is fully opened for maximum suction gas superheat. The embodiment according to FIG. 2 is unsuitable for cooling mode; in the embodiment according to FIG. 3, the expansion device 3, which is arranged between the heat exchanger 4 and the heat exchanger operating as the evaporator, is almost completely closed.

For the sake of completeness, finally the mode of operation of the refrigeration circuit device shown in FIG. 1 is explained in both operating modes (apart from the additional expansion device 8, this correspondingly applies to the embodiments according to FIGS. 2 and 3):

As already explained, FIG. 1 shows the operating mode I in which the heat exchanger provided with the reference sign 2 is operated as a condenser. In this operating mode, the refrigerant is initially compressed by the compressor 1 and conveyed to a first flow path of the changeover valve 10 and then to the condenser 2. Once it has arrived there, the refrigerant then condenses and releases heat. Then the refrigerant passes to the first expansion device 3 in order to be throttled there to a lower pressure. At the heat exchanger 4, on one side, heat is then transferred from the electronic device 7 to the refrigerant coming from the first expansion device 3, flowing through the primary side 4.1 of the heat exchanger 4. On the other side, at the same time heat is transferred from the primary side 4.1 of the heat exchanger 4 to the secondary side 4.2 thereof, more details thereof being provided below. Downstream of the primary side 4.1 the refrigerant then passes into the second expansion device 5 where it is throttled again to an even lower pressure. Then the refrigerant passes to the evaporator 6 where it is supplied with heat so that in any case it is partially evaporated. Downstream of the evaporator 6 the refrigerant then passes to the second flow path of the changeover valve 10 and from there to the liquid separator 9, already described above in more detail. The substantially vaporous refrigerant passes therefrom to the secondary side 4.2 of the heat exchanger 4, as already mentioned above, in order to absorb heat from the primary side 4.1 of the heat exchanger 4 which then, depending on the position of the expansion valves 3, 5, leads to an advantageous suction gas superheat of the refrigerant subsequently flowing to the compressor 1.

If the changeover valve 10 is now switched to the other operating mode (here the cooling mode), the refrigerant correspondingly no longer flows downstream of the compressor 1 at the changeover valve 10 to the heat exchanger 2 (previously the condenser) but directly to the heat exchanger 6 which now operates as a condenser, wherein refrigerant correspondingly flows through the second expansion device 5, the primary side 4.1 of the heat exchanger 4, the first expansion device 3 and the heat exchanger with the reference sign 2, which then operates as an evaporator, and then correspondingly in the reverse direction until the refrigerant then in turn passes to the changeover valve 10 and is also conducted therefrom back to the liquid separator 9, in order to pass back to the compressor after passing the secondary side 4.2 of the heat exchanger 4.

LIST OF REFERENCE SIGNS

1 Compressor
1.1 Pressure side
1.2 Suction side
2 Condenser
3 First expansion device
4 Internal heat exchanger
4.1 Primary side of internal heat exchanger
4.2 Secondary side of internal heat exchanger
5 Second expansion device
6 Evaporator
7 Electronic device
8 Additional expansion device
9 Liquid separator
10 Changeover valve

The invention claimed is:

1. A refrigeration circuit device, comprising:
a compressor (1) for compressing a refrigerant,
a condenser (2) connected downstream of the compressor (1) in a flow direction of the refrigerant,
a first expansion device (3) connected downstream of the condenser (2) in the flow direction of the refrigerant,
a heat exchanger (4) connected downstream of the first expansion device (3) in the flow direction of the refrigerant,
an electronic device (7) that is to be cooled connected to the heat exchanger (4),
a second expansion device (5) connected downstream of the heat exchanger (4) in the flow direction of the refrigerant,
an evaporator (6) connected downstream of the second expansion device (5) in the flow direction of the refrigerant,
wherein the compressor (1) is later connected downstream of the evaporator (6),
wherein the heat exchanger (4) is configured as an internal heat exchanger for transferring additional heat to the refrigerant, and comprises:
a primary side (4.1) which is connected to the first expansion device (3), and
a secondary side (4.2) which is connected on one hand to the evaporator (6) and another hand to the compressor (1).

2. The refrigeration circuit device according to claim 1, wherein the first and second expansion devices (3, 5) are configured to be controllable.

3. The refrigeration circuit device according to claim 1, wherein an additional expansion device (8) is arranged parallel to the heat exchanger (4) and between the condenser (2) and the evaporator (6).

4. The refrigeration circuit device according to claim 3, wherein the additional expansion device (8) is configured to be controllable and the first or second expansion device (3, 5) are configured to be selectively uncontrollable.

5. A method for operating a refrigeration circuit device according to claim 3, wherein the temperature of the electronic device (7) is selectively controlled with the aid of the first and/or second expansion device (3, 5).

6. The method according to claim 5, wherein the temperature of the electronic device (7) is selectively controlled with the aid of the first or the second expansion device (3, 5) and with the aid of the additional expansion device (8).

7. The method according to claim 5, wherein the refrigeration circuit device is selectively operated in heating mode or cooling mode.

8. The method according to claim 7, wherein in cooling mode, the second expansion device or the additional expansion device (5, 8) is fully opened for maximum suction gas superheat.

9. The method according to claim 7, further comprising selectively opening, in heating mode, the first expansion device (3) and/or the second expansion device (5) to transfer energy from the refrigerant condensed by the condenser to the refrigerant suctioned by the compressor to obtain a suction gas superheat of 5 to 15 K.

10. The refrigeration circuit device according to claim 1, wherein the additional expansion device (8) is configured to be controllable.

11. The refrigeration circuit device according to claim 1, wherein the heat exchanger (4) is configured as a plate heat exchanger.

* * * * *